US009224620B2

(12) United States Patent
Chen et al.

(10) Patent No.: US 9,224,620 B2
(45) Date of Patent: Dec. 29, 2015

(54) METHOD FOR PACKAGING QUAD FLAT NON-LEADED PACKAGE BODY, AND PACKAGE BODY

(71) Applicant: Huawei Technologies Co., Ltd., Shenzhen (CN)

(72) Inventors: Kai Chen, Shenzhen (CN); Zhihua Liu, Shenzhen (CN); Ran Jiang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/224,202

(22) Filed: Mar. 25, 2014

(65) Prior Publication Data

US 2014/0203432 A1    Jul. 24, 2014

Related U.S. Application Data

(63) Continuation of application No. PCT/CN2013/074736, filed on Apr. 25, 2013.

(30) Foreign Application Priority Data

Aug. 10, 2012  (CN) .......................... 2012 1 0284822

(51) Int. Cl.
  *H01L 21/48*    (2006.01)
  *H01L 23/495*   (2006.01)
  (Continued)

(52) U.S. Cl.
  CPC ........ *H01L 21/4828* (2013.01); *H01L 21/4825* (2013.01); *H01L 21/4832* (2013.01);
  (Continued)

(58) Field of Classification Search
  CPC ...................... H01L 21/4828; H01L 23/49805

USPC ................................... 257/737; 438/123, 121
See application file for complete search history.

(56) References Cited

U.S. PATENT DOCUMENTS 8,076,184 B1 *  12/2011  Camacho et al. ............. 438/123
2007/0090524 A1 *  4/2007  Abbott .......................... 257/731
(Continued)

FOREIGN PATENT DOCUMENTS

CN    101325190 A    12/2008
CN    101325191 A    12/2008
(Continued)

OTHER PUBLICATIONS

Foreign Communication From a Counterpart Application, Chinese Application No. 201210284822.8, Chinese Office Action dated Nov. 15, 2014, 7 pages.
(Continued)

*Primary Examiner* — Christine Enad
(74) *Attorney, Agent, or Firm* — Conley Rose, P.C.; Grant Rodolph

(57) ABSTRACT

A method for packaging a quad flat non-leaded (QFN) package body. The method includes: etching an upper surface of a metal plate to process a groove to form a bond wire bench, a component bench, and a bump; processing the bump to a preset height, and assembling a component on the component bench; packaging the processed metal plate to form a package body, and exposing the surface of the processed bump on an upper surface of the package body to form a top lead; and etching a lower surface of the package body to process a bottom lead. In the present invention, large passive components can be stacked on the QFN package body with a top lead; the structure is simplified while the reliability of the welding joints is improved; a plurality of components can be stacked through the top lead to overcome the limitations of component stacking.

8 Claims, 9 Drawing Sheets

(51) Int. Cl.
*H01L 23/498* (2006.01)
*H01L 23/31* (2006.01)
*H01L 23/00* (2006.01)

(52) U.S. Cl.
CPC .... *H01L23/49517* (2013.01); *H01L 23/49805* (2013.01); *H01L 23/3107* (2013.01); *H01L 24/48* (2013.01); *H01L 24/85* (2013.01); *H01L 2224/32245* (2013.01); *H01L 2224/48249* (2013.01); *H01L 2224/73265* (2013.01); *H01L 2924/12042* (2013.01)

(56) References Cited

U.S. PATENT DOCUMENTS

| | | | |
|---|---|---|---|
| 2008/0061414 A1* | 3/2008 | Retuta et al. | 257/676 |
| 2008/0067649 A1 | 3/2008 | Matsunaga et al. | |
| 2009/0050994 A1* | 2/2009 | Ishihara et al. | 257/432 |
| 2009/0127706 A1* | 5/2009 | Shen et al. | 257/737 |
| 2011/0042794 A1* | 2/2011 | Hsieh et al. | 257/676 |
| 2011/0147906 A1 | 6/2011 | Yang et al. | |
| 2011/0163430 A1 | 7/2011 | Lee et al. | |
| 2011/0291249 A1* | 12/2011 | Chi et al. | 257/675 |
| 2012/0241922 A1 | 9/2012 | Pagaila | |

FOREIGN PATENT DOCUMENTS

| | | | |
|---|---|---|---|
| CN | 101361163 A | 2/2009 | |
| CN | 101471307 A | 7/2009 | |
| CN | 101764127 A | 6/2010 | |
| CN | 102832139 A | 12/2012 | |
| JP | 2008071815 A | 3/2008 | |
| WO | 2007051142 A2 | 5/2007 | |

OTHER PUBLICATIONS

Partial English Translation and Abstract of Chinese Patent Application No. CN101325190A, Mar. 12, 2014, 5 pages.
Partial English Translation and Abstract of Chinese Patent Application No. CN101325191A, Mar. 12, 2014, 6 pages.
Foreign Communication From a Counterpart Application, Chinese Application No. 201210284822.8, Chinese Office Action dated Jun. 16, 2014, 7 pages.
Foreign Communication From a Counterpart Application, European Application No. 13756799.5, Extended European Search Report dated Jul. 29, 2014, 7 pages.
Foreign Communication From a Counterpart Application, PCT Application No. PCT/CN2013/074736, English Translation of International Search Report dated Aug. 1, 2013, 3 pages.
Foreign Communication From a Counterpart Application, PCT Application No. PCT/CN2013/074736, Written Opinion dated Aug. 1, 2013, 6 pages.
Foreign Communication From a Counterpart Application, European Application No. 13756799.6, European Office Action dated Mar. 9, 2015, 6 pages.
Partial English Translation and Abstract of Japanese Patent Application No. JP2008071815A, Apr. 29, 2015, 75 pages.
Foreign Communication From a Counterpart Application, Japanese Application No. 2014528850, Japanese Office Action dated Mar. 12, 2015, 5 pages.
Foreign Communication From a Counterpart Application, Japanese Application No. 2014528850, English Translation of Japanese Office Action dated Mar. 12, 2015, 7 pages.

* cited by examiner

| 401 |
|---|
| Etch an upper surface of a metal plate to process a desired groove and form a bond wire bench, a component bench, and a bump |

▼

| 402 |
|---|
| Apply an electroplating process to electroplate the surface of the bump to grow a bump of a preset height, assemble a component on the component bench, and connect the component and the bond wire bench |

▼

| 403 |
|---|
| Package the processed metal plate in plastic to form a package body, and etch an upper surface of the package body to expose the surface of the processed bump; apply an electroplating process to form a weld surface on the exposed surface of the bump |

▼

| 404 |
|---|
| Plant a solder ball on the welding surface or use a stencil solder printing technology to print solder paste on the welding surface, and use a high temperature reflow technology to make the solder ball or solder paste form the top lead on the upper surface of the package body |

▼

| 405 |
|---|
| Etch a lower surface of the package body to process a desired bottom lead and obtain a quad flat non-leaded package body |

FIG. 4

METHOD FOR PACKAGING QUAD FLAT NON-LEADED PACKAGE BODY, AND PACKAGE BODY

CROSS-REFERENCE TO RELATED APPLICATIONS

This application is a continuation of International Application No. PCT/CN2013/074736, filed on Apr. 25, 2013, which claims priority to Chinese Patent Application No. 201210284822.8, filed on Aug. 10, 2012, both of which are hereby incorporated by reference in their entireties.

TECHNICAL FIELD

The present invention relates to the field of packaging technologies, and in particular, to a method for packaging a quad flat non-leaded package body, and a package body.

BACKGROUND

Nowadays, density of electronic parts and components on a Printed Circuit Board (PCB) is increasingly high from an end consumable to a system equipment, more electronic parts and components need to be installed in the same or even smaller space, and the demand for miniaturizing the electronic parts and components is increasingly strong. Quad Flat Non-leaded (QFN) packages have been widely applied in recent years gradually due to its small dimensions, small size, and high thermal and electrical performance.

In a prior art, there are two types of QFN package bodies. One is a QFN package form based on Package in Package (PiP), which applies plastic packaging twice to achieve stacking of a plurality of components in one package body; and the other is a QFN package form based on Package on Package (PoP), which uses means such as grinding to form an exposed weldable lead surface on a lower package body, thus implementing a package structure where one package body is stacked on another package body.

The prior art implements two layers of stacking, but the number of layers of stacked components is still limited, which has certain limitations. Moreover, all stacked components are placed in the package body, which leads to the low reliability of internal welding joints and a structure that is not concise enough.

SUMMARY

Embodiments of the present invention provide a method for packaging a quad flat non-leaded package body, and a package body to resolve the limitations of component stacking and problems of the low reliability of internal welding joints and a structure that is not concise enough. The technical solutions are as follows:

In a first aspect, a method for packaging a quad flat non-leaded package body is provided, where the method includes: etching an upper surface of a metal plate to process a desired groove and form a bond wire bench, a component bench, and a bump; processing the bump to reach a preset height, assembling a component on the component bench, and connecting the component and the bond wire bench; packaging the processed metal plate in plastic to form a package body, and exposing the surface of the processed bump on an upper surface of the package body to form a top lead; and etching a lower surface of the package body to process a desired bottom lead and obtain a quad flat non-leaded package body.

With reference to the first aspect, in a first possible implementation mode of the first aspect, the processing the bump to reach a preset height specifically is applying an electroplating process to electroplate the surface of the bump to grow a bump of the preset height.

With reference to the first aspect, in a second possible implementation mode of the first aspect, the processing the bump to reach a preset height specifically is applying an electroplating process to form a welding surface on the surface of the bump, printing solder paste on the welding surface, and then welding a metal rod with the solder paste to make the bump reach the preset height.

With reference to the first aspect, the first possible implementation mode of the first aspect or the second possible implementation mode of the first aspect, in a third possible implementation mode of the first aspect, the packaging the processed metal plate in plastic to form a package body, and the exposing the surface of the processed bump on an upper surface of the package body to form a top lead, specifically are, applying a packaging process with a protective film to package the processed metal plate in plastic to form the package body, and removing the protective film after the plastic-packaging to expose the surface of the processed bump on the upper surface of the package body to form the top lead.

With reference to the first aspect, the first possible implementation mode of the first aspect or the second possible implementation mode of the first aspect, in a fourth possible implementation mode of the first aspect, the packaging the processed metal plate in plastic to form a package body, and the exposing the surface of the processed bump on an upper surface of the package body to form a top lead, specifically are, packaging the processed metal plate in plastic to form a package body, and etching an upper surface of the package body to expose the surface of the processed bump; and applying an electroplating process to form a welding surface on the exposed surface of the bump, planting a solder ball on the welding surface, and using a high temperature reflow technology to make the solder ball form the top lead on the upper surface of the package body.

With reference to the first aspect, the first possible implementation mode of the first aspect or the second possible implementation mode of the first aspect, in a fifth possible implementation mode of the first aspect, the packaging the processed metal plate in plastic to form a package body, and the exposing the surface of the processed bump on an upper surface of the package body to form a top lead, specifically are, packaging the processed metal plate in plastic to form a package body, and etching an upper surface of the package body to expose the surface of the processed bump; and applying an electroplating process to form a welding surface on the exposed surface of the bump, using a stencil solder printing technology to print solder paste on the welding surface, and using a high temperature reflow technology to make the solder paste form the top lead on the upper surface of the package body.

With reference to the first aspect, in a sixth possible implementation mode of the first aspect, before the processing the bump to reach a preset height, the method further includes forming a protective layer on the upper surface of the metal plate except the surface of the bump to expose the surface of the bump.

With reference to the first aspect, in a seventh possible implementation mode of the first aspect, before the assembling a component on the component bench and connecting the component and the bond wire bench, the method further includes applying an electroplating process to electroplate a metal layer of a preset thickness for chip mounting and wire seating on the metal plate.

In a second aspect, a quad flat non-leaded package body is provided, where the package body includes a metal plate, a component, a bond wire, a plastic package body, and a top lead and a bottom lead for welding electronic parts and components, where the plastic package body packages in plastic the metal plate, the component, the bond wire, the top lead, and the bottom lead into an entirety; the component is connected to the bond wire, and welded onto the metal plate in the package body; the top lead is exposed on an upper surface of the package body; and the bottom lead is exposed on a lower surface of the package body.

With reference to the second aspect, in a first possible implementation mode of the second aspect, the component includes a chip, a passive component or a flip chip.

The technical solutions provided in the embodiments of the present invention bring the following benefits:

A QFN package body with a top lead, used for component stacking is formed, and therefore, large passive components can be stacked on the QFN package body while the high electrical performance and heat dissipation performance of the QFN package are exerted; the structure of the package body is simplified while the reliability of internal and external welding joints is improved; in addition, a plurality of components can be stacked through the top lead to overcome the limitations of component stacking.

BRIEF DESCRIPTION OF DRAWINGS

To illustrate the technical solutions in the embodiments of the present invention more clearly, the following briefly introduces the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

FIG. 4 is a flowchart of a third method for packaging a quad flat non-leaded package body according to another embodiment of the present invention;

DESCRIPTION OF EMBODIMENTS

To make the objectives, technical solutions, and advantages of the present invention more comprehensible, the following further describes the embodiments of the present invention in detail with reference to the accompanying drawings.

Figure 1:
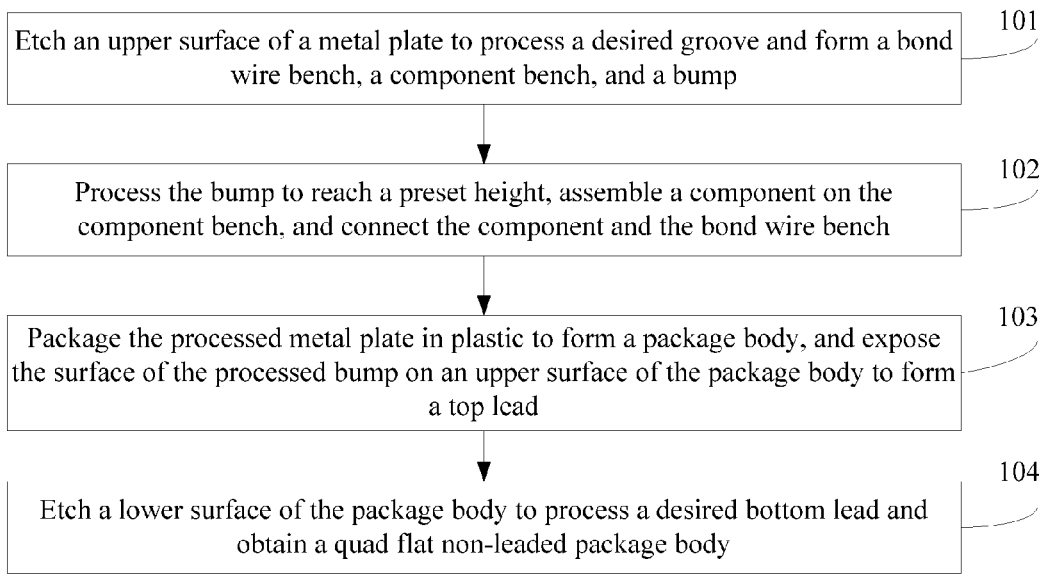
FIG. 1 is a flowchart of a first method for packaging a quad flat non-leaded package body according to an embodiment of the present invention.

An embodiment of the present invention provides a method for packaging a quad flat non-leaded package body. As shown in FIG. 1, a process of the method in this embodiment is detailed below:

101. Etch an upper surface of a metal plate to process a desired groove and form a bond wire bench, a component bench, and a bump.

102. Process the bump to reach a preset height, assemble a component on the component bench, and connect the component and the bond wire bench.

Optionally, before processing the bump to reach a preset height, the method further includes forming a protective layer on the upper surface of the metal plate except the surface of the bump to expose the surface of the bump.

The processing the bump to reach a preset height specifically includes, but is not limited to, applying an electroplating process to electroplate the surface of the bump to grow a bump of the preset height.

Optionally, the processing the bump to reach a preset height specifically includes, but is not limited to, applying an electroplating process to form a welding surface on the surface of the bump, printing solder paste on the welding surface, and then welding a metal rod with the solder paste to make the bump grow to the preset height.

Optionally, before assembling a component on the component bench and connecting the component and the bond wire bench, the method further includes applying an electroplating process to electroplate a metal layer of a preset thickness for chip mounting and wire seating on the metal plate.

103. Package the processed metal plate in plastic to form a package body, and expose the surface of the processed bump on an upper surface of the package body to form a top lead.

In this step, packaging the processed metal plate in plastic to form a package body and exposing the surface of the processed bump on an upper surface of the package body to form a top lead specifically include, but are not limited to, applying a packaging process with a protective film to package the processed metal plate in plastic to form the package body, and removing the protective film after the plastic-packaging to expose the surface of the processed bump on the upper surface of the package body to form the top lead.

Optionally, packaging the processed metal plate in plastic to form a package body and exposing the surface of the processed bump on an upper surface of the package body to form a top lead specifically include, but are not limited to, packaging the processed metal plate in plastic to form a package body, and etching an upper surface of the package body to expose the surface of the processed bump; and applying an electroplating process to form a welding surface on the exposed surface of the bump, planting a solder ball on the welding surface, and using a high temperature reflow technology to make the solder ball form the top lead on the upper surface of the package body.

Optionally, packaging the processed metal plate in plastic to form a package body and exposing the surface of the processed bump on an upper surface of the package body to form a top lead specifically include, but are not limited to, packaging the processed metal plate in plastic to form a package body, and etching an upper surface of the package body to expose the surface of the processed bump; and applying an electroplating process to form a welding surface on the exposed surface of the bump, using a stencil solder printing technology to print solder paste on the welding surface, and using a high temperature reflow technology to make the solder paste form the top lead on the upper surface of the package body.

104. Etch a lower surface of the package body to process a desired bottom lead and obtain a quad flat non-leaded package body.

In the method provided in this embodiment, a QFN package body with a top lead, used for component stacking, is formed, and therefore, large passive components can be stacked on the QFN package body while the high electrical performance and heat dissipation performance of the QFN package are exerted; the structure of the package body is simplified while the reliability of internal and external welding joints is improved; in addition, a plurality of components can be stacked through the top lead to overcome the limitations of component stacking.

Figure 2:
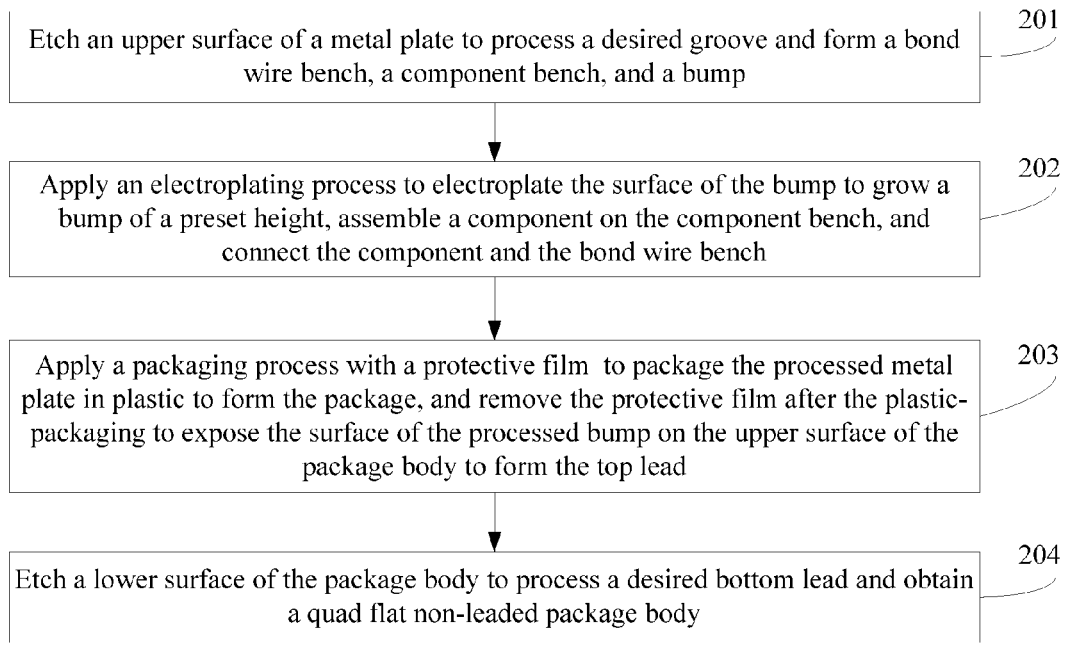
FIG. 2 is a flowchart of a second method for packaging a quad flat non-leaded package body according to another embodiment of the present invention.

To expound the method in the foregoing embodiment more clearly, the following embodiment describes a method for packaging a quad flat non-leaded package body in detail with reference to the above content:

Another embodiment of the present invention provides a method for packaging a quad flat non-leaded package body. For ease of description, with reference to the content in the preceding embodiment, this embodiment describes the packaging method exemplarily, assuming that an electroplating process is applied to process a bump to reach a preset height and that a packaging process with a protective film is applied to perform plastic-packaging. Specifically, as shown in FIG. 2, a process of the method provided in this embodiment is detailed below:

201. Etch an upper surface of a metal plate to process a desired groove and form a bond wire bench, a component bench, and a bump.

Figure 3:
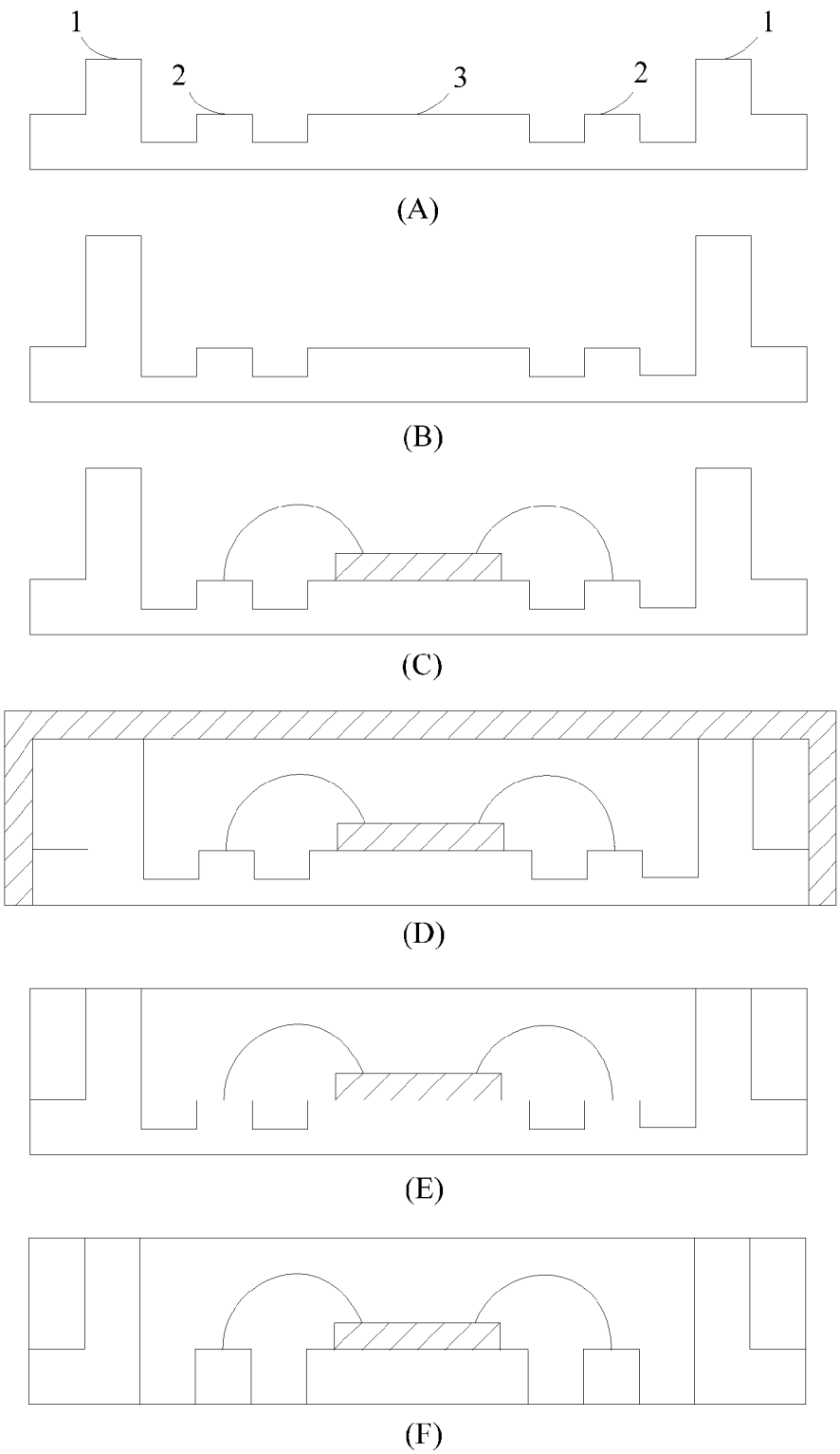
FIG. 3A-3F are schematic diagrams of a first process of packaging a quad flat non-leaded package body according to another embodiment of the present invention.

In this step, when the upper surface of the metal plate is etched to process the desired groove, an existing photoresist procedure may be used to form a patterned photoresist pattern on the upper surface of the metal plate, and a proper etching solution is used to etch the upper surface of the metal plate to process the desired groove, as shown in FIG. 3A. In FIG. 3A, 1 is a bump, 2 is a bond wire bench, and 3 is a component bench.

202. Apply an electroplating process to electroplate the surface of the bump to grow a bump of a preset height, assemble a component on the component bench, and connect the component and the bond wire bench.

Specifically, to make it easier in this step to apply an electroplating process to electroplate the surface of the bump to grow a bump of a preset height, before step 202, the method provided in this embodiment further includes a process of forming a protective layer on the upper surface of the metal plate except the surface of the bump. In practice, a photoresist procedure may be used to form a protective layer on the upper surface of the metal plate except the surface of the bump shown in FIG. 3A, and expose only the surface metal of the bump to facilitate subsequent electroplating.

When an existing selective electroplating process is applied to continue electroplating the surface of the bump to grow a bump of the preset height, this embodiment does not limit the value of the preset height, and the height may be set according to actual conditions. After the bump grows to the preset height, the metal plate may be shown in FIG. 3B.

Before assembling a component on the component bench and connecting the component and the bond wire bench are performed, an existing selective electroplating technology may be used to electroplate a metal layer (not illustrated) of a preset thickness for chip mounting and wire seating on the metal plate shown in FIG. 3B. Existing chip mounting is used to assemble the component on the component bench and an existing wire seating technology is used to connect the component and the bond wire bench through wire seating, as shown in FIG. 3C.

203. Apply a packaging process with a protective film to package the processed metal plate in plastic to form a package body, and remove the protective film after the plastic-packaging to expose the surface of the processed bump on the upper surface of the package body to form a top lead.

In this step, when a packaging process with a protective film is applied to package the processed metal plate in plastic, an existing plastic-packaging process with a protective film may be used to package the assembly in plastic shown in FIG. 3C, and the package body after the plastic-packaging is shown in FIG. 3D. Due to protection of the protective film, after the plastic-packaging, the bump grown by the electroplating may be exposed on the surface of the plastic package of the package body. Therefore, the surface of the processed bump is exposed on the upper surface of the package body to form a top lead, as shown in FIG. 3E.

204. Etch a lower surface of the package body to process a desired bottom lead and obtain a quad flat non-leaded package body.

Specifically, when the lower surface of the package body is etched to process the desired bottom lead, an existing photoresist procedure may also be used to make a pattern of a desired shape on the lower surface of the package body shown in FIG. 3E, and a proper etching solution is used to etch and form the finally desired bottom lead, as shown in FIG. 3F.

In the method provided in this embodiment, a QFN package body with a top lead, used for component stacking, is formed, and therefore, large passive components can be stacked on the QFN package body while the high electrical performance and heat dissipation performance of the QFN package are exerted; the structure of the package body is simplified while the reliability of internal and external welding joints is improved; in addition, a plurality of components can be stacked through the top lead to overcome the limitations of component stacking.

Another embodiment of the present invention provides a method for packaging a quad flat non-leaded package body. For ease of description, with reference to the content in the preceding embodiment, this embodiment describes the packaging method exemplarily, assuming that an electroplating process is applied to process a bump to reach a preset height and that a high temperature reflow technology is used to form a top lead on the surface of the package body. Specifically, as shown in FIG. 4, a process of the method provided in this embodiment is detailed below:

401. Etch an upper surface of a metal plate to process a desired groove and form a bond wire bench, a component bench, and a bump.

Figure 5:
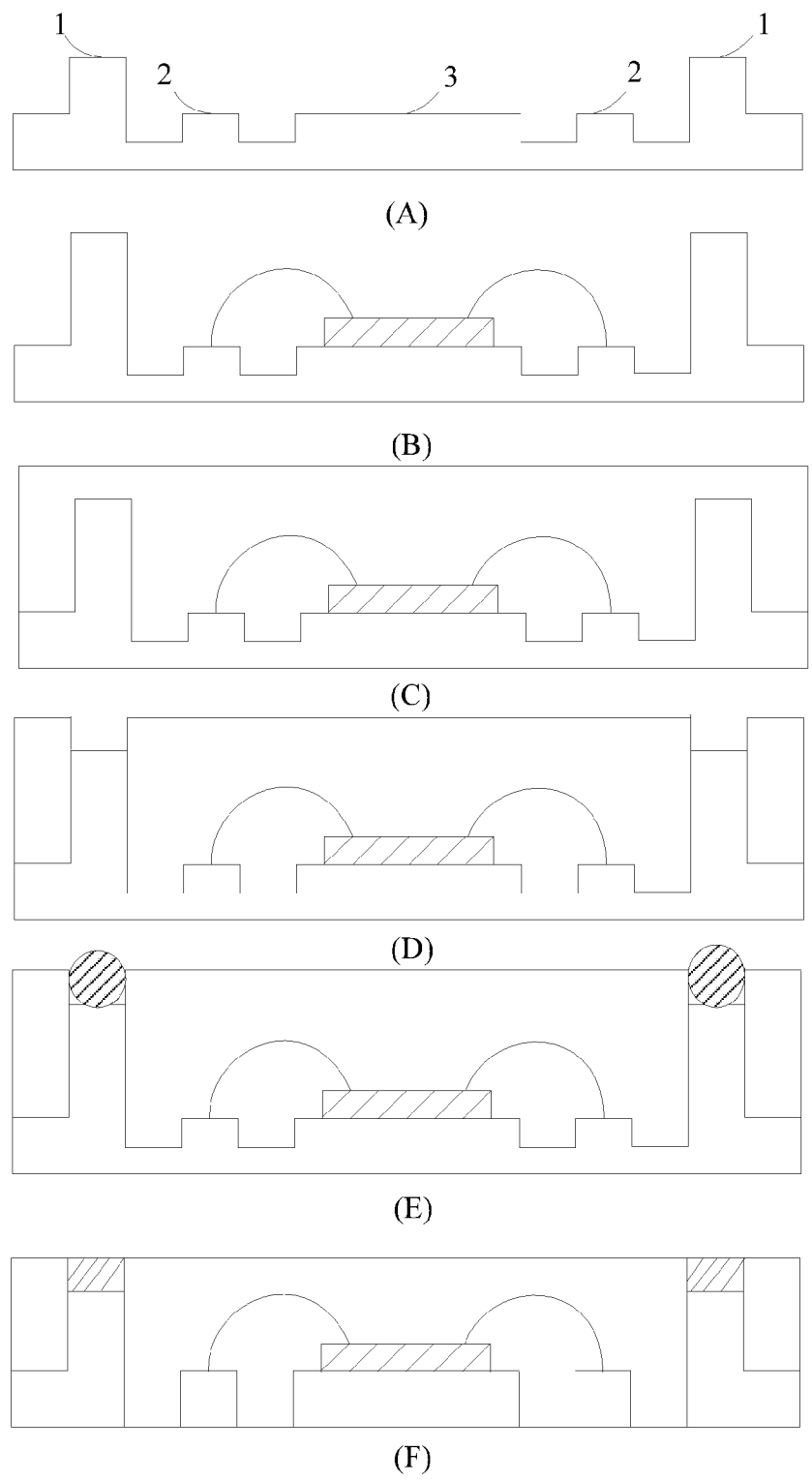
FIG. 5A-5F are schematic diagrams of a second process of packaging a quad flat non-leaded package body according to another embodiment of the present invention.

Specifically, this step may be implemented in the same way as step 201 in the preceding embodiment to obtain a structure shown in FIG. 5A. For details, reference may be made to the relevant description of step 201 in the preceding embodiment. No repeated description is given here any further.

402. Apply an electroplating process to electroplate the surface of the bump to grow a bump of a preset height, assemble a component on the component bench, and connect the component and the bond wire bench.

Specifically, this step may be implemented in the same way as step 202 in the preceding embodiment to obtain a structure shown in FIG. 5B. For details, reference may be made to the relevant description of step 202 in the preceding embodiment. No repeated description is given here any further.

403. Package the processed metal plate in plastic to form a package body, etch an upper surface of the package body to expose the surface of the processed bump, and apply an electroplating process to form a welding surface on the exposed surface of the bump.

In this step, an existing plastic-packaging process may be used to package the assembly in plastic shown in FIG. 5B, and form a package body shown in FIG. 5C. Then an existing laser etching technology may be used to etch off a certain thickness of the package body in a specific position to expose an internal lead and obtain a structure shown in FIG. 5D. In addition, to obtain the bump of the preset height subsequently, a clean technology and a selective electroplating technology are used to form a weldable surface (not illustrated) on the exposed top lead.

404. Plant a solder ball on the welding surface or use a stencil solder printing technology to print solder paste on the welding surface, and use a high temperature reflow technology to make the solder ball or solder paste form the top lead on the upper surface of the package body.

Specifically, an existing solder ball planting technology is used to plant a solder ball at the exposed top lead, as shown in FIG. 5E. Alternatively, an existing high temperature reflow technology is used to make the solder ball form a top lead, which is weldable to other external components, on the upper surface of the exposed top lead, as shown in FIG. 5E. Alternatively, an existing stencil solder printing technology is used to print solder paste on the top lead of the assembly shown in FIG. 5D, and an existing high temperature reflow technology is used to make the solder paste form a top lead, which is weldable to other external modules, on the upper surface of the exposed top lead, as shown in FIG. 5E.

405. Etch a lower surface of the package body to process a desired bottom lead and obtain a quad flat non-leaded package body.

Specifically, this step may be implemented in the same way as step 204 in the preceding embodiment. For details, reference may be made to the relevant description of step 204 in the preceding embodiment. No repeated description is given here any further.

In the method provided in this embodiment, a QFN package body with a top lead used for component stacking is formed, and therefore, large passive components can be stacked on the QFN package body while the high electrical performance and heat dissipation performance of the QFN package are exerted; the structure of the package body is simplified while the reliability of internal and external welding joints is improved; in addition, a plurality of components can be stacked through the top lead to overcome the limitations of component stacking.

Figure 6:
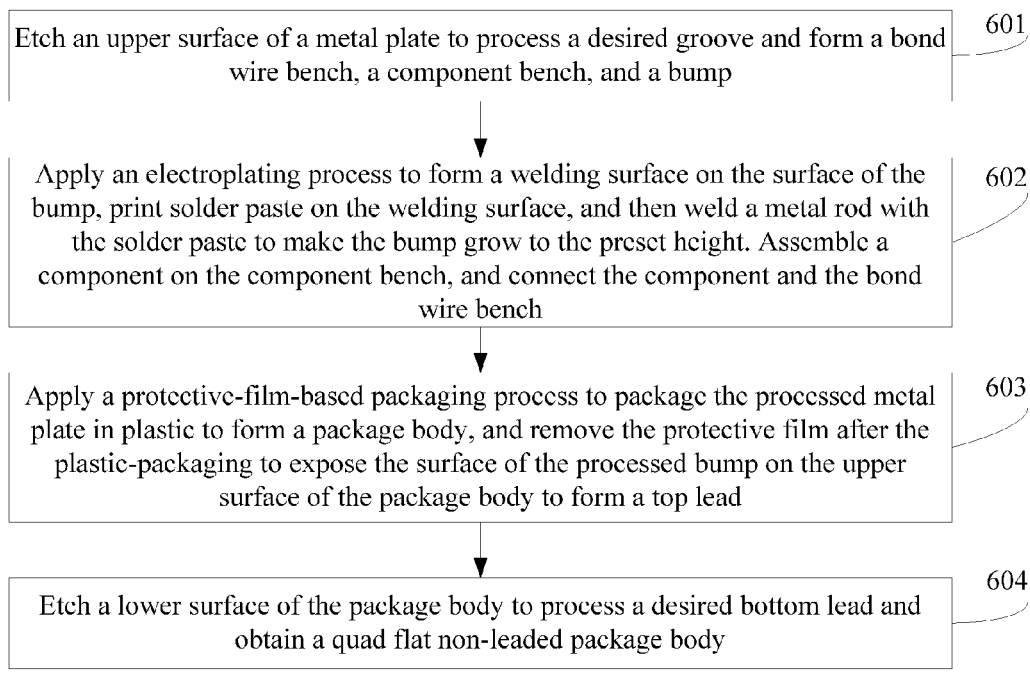
FIG. 6 is a flowchart of a fourth method for packaging a quad flat non-leaded package body according to another embodiment of the present invention.

Another embodiment of the present invention provides a method for packaging a quad flat non-leaded package body. For ease of description, with reference to the content in the preceding embodiment, this embodiment describes the packaging method exemplarily, assuming that an electroplating process is applied and a metal rod is welded to process a bump to reach a preset height and that a packaging process with a protective film is used to perform plastic-packaging. Specifically, as shown in FIG. 6, a process of the method provided in this embodiment is detailed below:

601. Etch an upper surface of a metal plate to process a desired groove and form a bond wire bench, a component bench, and a bump.

Figure 7:
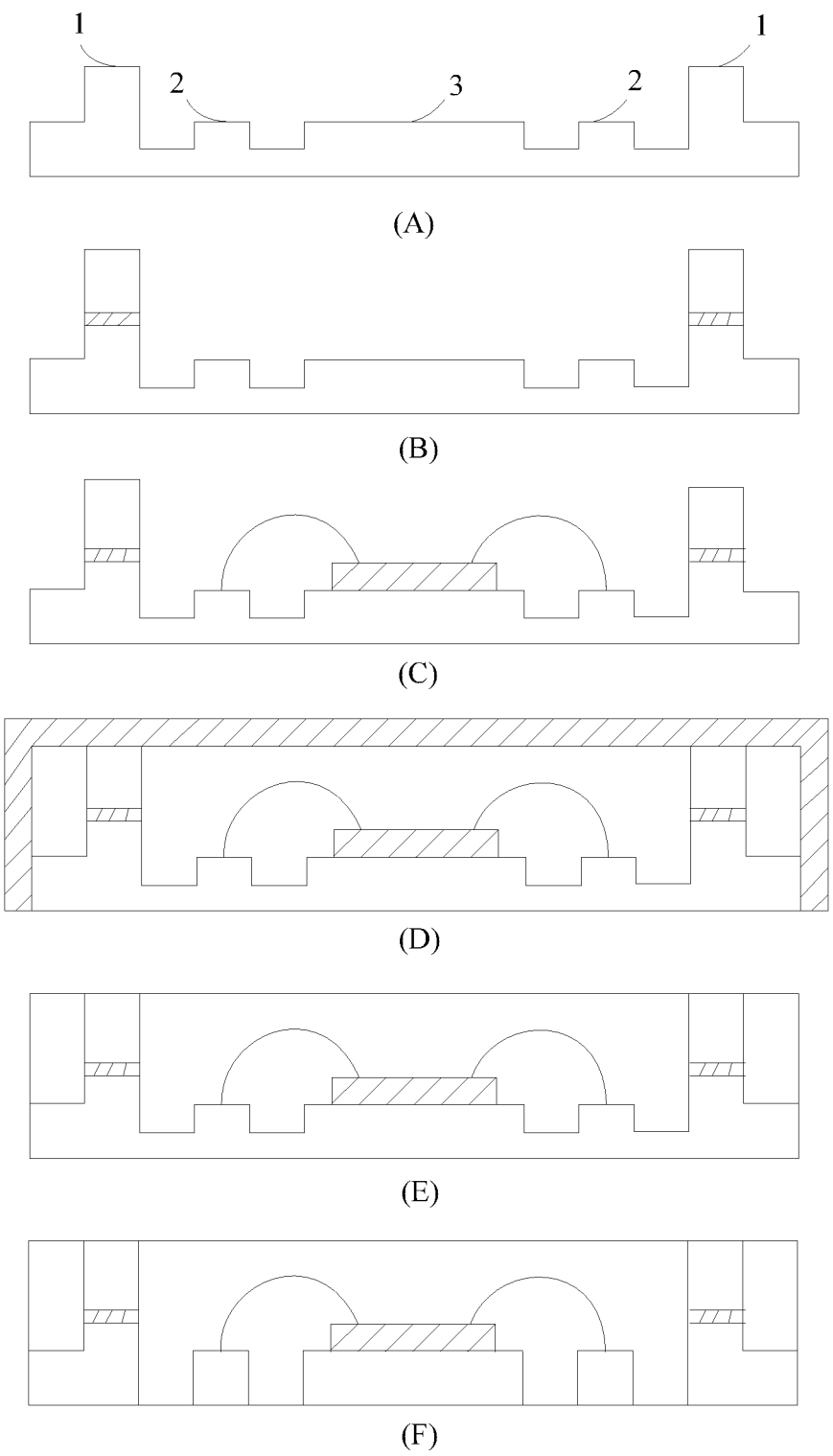
FIG. 7A-7F are schematic diagrams of a third process of packaging a quad flat non-leaded package body according to another embodiment of the present invention.

Specifically, this step may be implemented in the same way as step 201 in the preceding embodiment to obtain a structure shown in FIG. 7A. For details, reference may be made to the relevant description of step 201 in the preceding embodiment. No repeated description is given here any further.

602. Apply an electroplating process to form a welding surface on the surface of the bump, print solder paste on the welding surface, and then weld a metal rod with the solder paste to make the bump grow to a preset height. Assemble a component on the component bench, and connect the component and the bond wire bench.

In this step, a selective electroplating technology is used to form a weldable surface on the bump shown in FIG. 7A; an existing stencil printing technology is used to print a layer of solder paste on the weldable surface; and then a Surface Mount Technology (SMT) is used to mount a metal rod of a specific height on the bump to obtain the bump of the preset height, as shown in FIG. 7B. Subsequently, in the method of assembling the component and connecting the component and the bond wire as described in step 202 in the preceding embodiment, the component is assembled on the component bench, and the component and the bond wire bench are connected to obtain a structure shown in FIG. 7C.

603. Apply a packaging process with a protective film to package the processed metal plate in plastic to form a package body, and remove the protective film after the plastic-packaging to expose the surface of the processed bump on the upper surface of the package body to form a top lead.

Specifically, this step may be implemented in the same way as step 203 in the preceding embodiment to obtain structures shown in FIG. 7D to FIG. 7E. For details, reference may be made to the relevant description of step 203 in the preceding embodiment. No repeated description is given here any further.

604. Etch a lower surface of the package body to process a desired bottom lead and obtain a quad flat non-leaded package body.

Specifically, this step may be implemented in the same way as step 204 in the preceding embodiment to obtain a structure shown in FIG. 7F. For details, reference may be made to the relevant description of step 204 in the preceding embodiment. No repeated description is given here any further.

In the method provided in this embodiment, a QFN package body with a top lead, used for component stacking, is formed, and therefore, large passive components can be stacked on the QFN package body while the high electrical performance and heat dissipation performance of the QFN package are exerted; the structure of the package body is simplified while the reliability of internal and external welding joints is improved; in addition, a plurality of components can be stacked through the top lead to overcome the limitations of component stacking.

Figure 8:
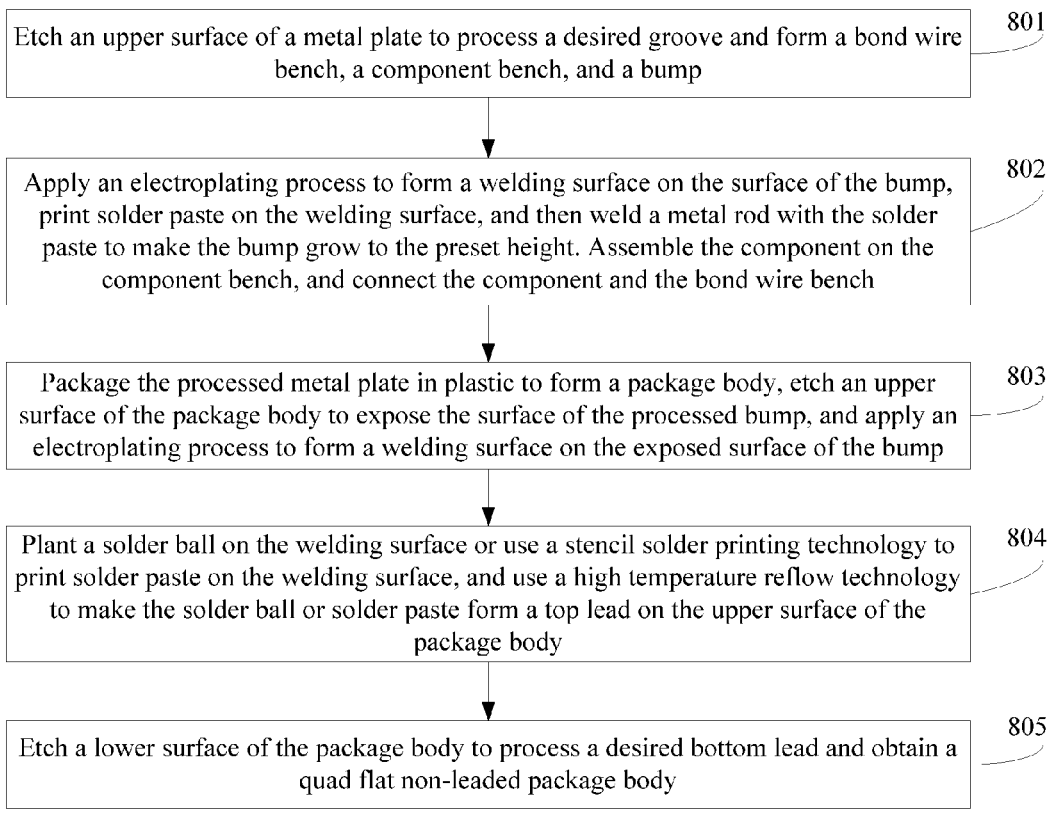
FIG. 8 is a flowchart of a fifth method for packaging a quad flat non-leaded package body according to another embodiment of the present invention.

Another embodiment of the present invention provides a method for packaging a quad flat non-leaded package body. For ease of description, with reference to the content in the preceding embodiment, this embodiment describes the packaging method exemplarily, assuming that an electroplating process is applied and a metal rod is welded to process a bump to reach a preset height and that a high temperature reflow technology is used to form a top lead on the surface of the package body. Specifically, as shown in FIG. 8, a process of the method provided in this embodiment is detailed below:

801. Etch an upper surface of a metal plate to process a desired groove and form a bond wire bench, a component bench, and a bump.

Figure 9:
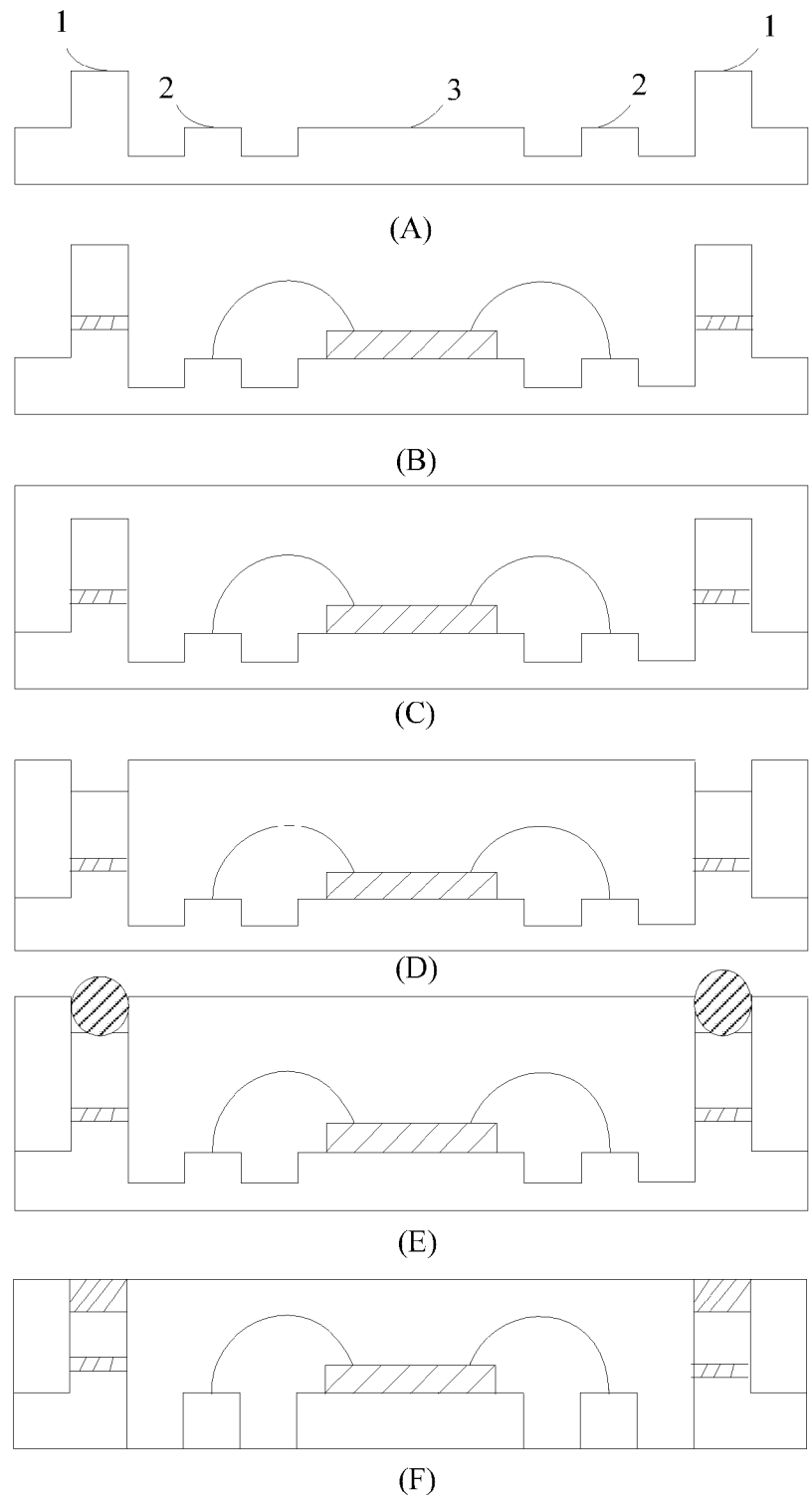
FIG. 9A-9F are schematic diagrams of a fourth process of packaging a quad flat non-leaded package body according to another embodiment of the present invention.

Specifically, this step may be implemented in the same way as step 201 in the preceding embodiment to obtain a structure shown in FIG. 9A. For details, reference may be made to the relevant description of step 201 in the preceding embodiment. No repeated description is given here any further.

802. Apply an electroplating process to form a welding surface on the surface of the bump, print solder paste on the welding surface, and then weld a metal rod with the solder paste to make the bump grow to a preset height. Assemble a component on the component bench, and connect the component and the bond wire bench.

Specifically, this step may be implemented in the same way as step 602 in the preceding embodiment to obtain a structure shown in FIG. 9B. For details, reference may be made to the relevant description of step 602 in the preceding embodiment. No repeated description is given here any further.

803. Package the processed metal plate in plastic to form a package body, and etch an upper surface of the package body to expose the surface of the processed bump. Apply an electroplating process to form a welding surface on the exposed surface of the bump.

Specifically, this step may be implemented in the same way as step 403 in the preceding embodiment to obtain structures shown in FIG. 9C to FIG. 9D. For details, reference may be made to the relevant description of step 403 in the preceding embodiment. No repeated description is given here any further.

804. Plant a solder ball on the welding surface or use a stencil solder printing technology to print solder paste on the welding surface, and use a high temperature reflow technology to make the solder ball or solder paste form a top lead on the upper surface of the package body.

Specifically, this step may be implemented in the same way as step 404 in the preceding embodiment to obtain a structure shown in FIG. 9E. For details, reference may be made to the relevant description of step 404 in the preceding embodiment. No repeated description is given here any further.

805. Etch a lower surface of the package body to process a desired bottom lead and obtain a quad flat non-leaded package body.

Specifically, this step may be implemented in the same way as step 204 in the preceding embodiment to obtain a structure shown in FIG. 9F. For details, reference may be made to the relevant description of step 204 in the preceding embodiment. No repeated description is given here any further.

In the method provided in this embodiment, a QFN package body with a top lead used for component stacking is formed, and therefore, large passive components can be stacked on the QFN package body while the high electrical performance and heat dissipation performance of the QFN package are exerted; the structure of the package body is simplified while the reliability of internal and external welding joints is improved; in addition, a plurality of components can be stacked through the top lead to overcome the limitations of component stacking.

Figure 10:
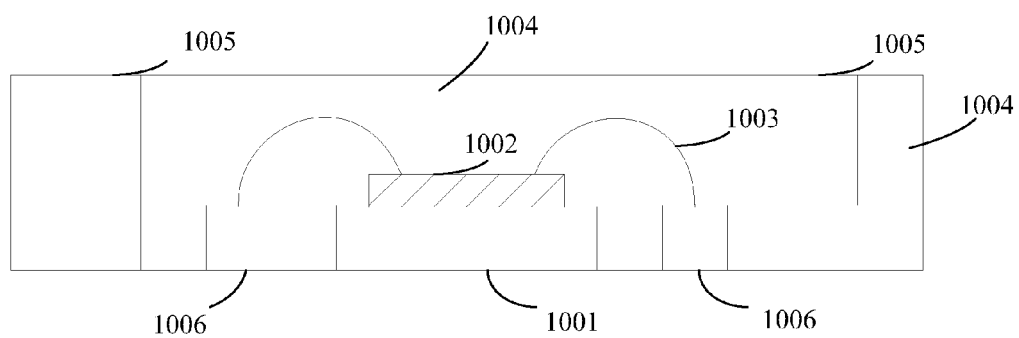
FIG. 10 is a schematic structural diagram of a quad flat non-leaded package body according to an embodiment of the present invention.

Another embodiment of the present invention provides a quad flat non-leaded package body. As shown in FIG. 10, the package body includes a metal plate 1001, a component 1002, a bond wire 1003, a plastic package body 1004, and a top lead 1005 and a bottom lead 1006 for welding electronic parts and components, where the plastic package body 1004 packages in plastic the metal plate 1001, the component 1002, the bond wire 1003, the top lead 1005, and the bottom lead 1006 into an entirety; the component 1002 is connected to the bond wire 1003, and welded onto the metal plate 1001 in the package body; and the top lead 1005 is exposed on the upper surface of the package body, and the bottom lead 1006 is exposed on the lower surface of the package body.

It should be noted that FIG. 10 shows only one structure of the package body provided in the embodiment. The package body provided in the embodiment may also be shown in FIG. 5F, FIG. 7F, and FIG. 9F, and may have other shapes and internal structures. The embodiment does not limit the specific shape and the internal structure of the package body.

The component mentioned in this embodiment and each of the above embodiments includes a chip, a passive component, or a flip chip. This embodiment does not limit the specific type of component. In addition, the shapes of the component bench may include other shapes in addition to the shapes shown in the accompanying drawings, and this embodiment does not limit the shape of the component bench.

With a top lead exposed on the surface of the package body, the package body provided in this embodiment can be used for component stacking, and therefore, large passive components can be stacked on the QFN package body while the high electrical performance and heat dissipation performance of the QFN package are exerted; the structure of the package body is simplified while the reliability of internal and external welding joints is improved; in addition, a plurality of components can be stacked through the top lead to overcome the limitations of component stacking.

The sequence number of an embodiment of the present invention is for ease of description only, and does not represent the priority of the embodiment.

Persons of ordinary skill in the art understand that all or part of the steps of the embodiments may be implemented by hardware or by a program instructing relevant hardware. The program may be stored in a computer readable storage medium such as a read-only memory, a disk, an optical disk, or the like.

The foregoing description is merely about exemplary embodiments of the present invention, but is not intended to limit the present invention. Any modification, equivalent replacement, or improvement made within the spirit and principle of the present invention shall fall within the protection scope of the present invention.

What is claimed is:

1. A method for packaging a quad flat non-leaded package body, comprising:
   etching an upper surface of a metal plate to process a desired groove and form a bond wire bench, a component bench, and a bump;
   forming a protective layer on the upper surface of the metal plate except a surface of the bump to expose the surface of the bump;
   processing the bump to reach a preset height;
   assembling a component on the component bench;
   connecting the component and the bond wire bench;
   packaging the processed metal plate in plastic to form a package body;
   exposing a surface of the processed bump on a first side of the package body to form a first side lead that is used for component stacking of the quad flat non-leaded package body, wherein the quad flat non-leaded package body comprises the first side, a second side opposite the first side, a third side that is adjacent to the first side and the second side, a fourth side that is adjacent to the first side and the second side and that is opposite the third side, a fifth side that is adjacent to the first side, the second side, the third side, and the fourth side, and a sixth side that is adjacent to the first side, the second side, the third side, and the fourth side and that is opposite the fifth side; and etching the second side of the package body to process a desired bottom lead and obtain a quad flat non-leaded package body, wherein the bump is not electrically connected to the component after etching the second side of the package body, and wherein the bump acts as the first side lead and an electrically conductive path between the first side and the second side.

2. The method according to claim 1, wherein processing the bump to reach the preset height comprises applying an electroplating process to electroplate the surface of the bump to form a bump of the preset height.

3. The method according to claim 1, wherein processing the bump to reach the preset height comprises:

applying an electroplating process to form a welding surface on the surface of the bump;

printing solder paste on the welding surface; and then welding a metal rod with the solder paste to make the bump grow to the preset height.

4. The method according to claim 1, wherein packaging the processed metal plate in the plastic to form the package body and exposing the surface of the processed bump on the first side of the package body to form top-first side lead comprise:

applying a packaging process with a protective film to package the processed metal plate in the plastic to form the package body; and removing the protective film after the plastic-packaging to expose the surface of the processed bump on the first side of the package body to form the first side lead.

5. The method according to claim 1, wherein packaging the processed metal plate in the plastic to form the package body and exposing the surface of the processed bump on the first side of the package body to form the first side lead comprise:

packaging the processed metal plate in the plastic to form the package body;

etching the first side of the package body to expose the surface of the processed bump;

applying the electroplating process to form the welding surface on the exposed surface of the bump;

planting a solder ball on the welding surface; and using a high temperature reflow technology to make the solder ball form the first side lead on the first side of the package body.

6. The method according to claim 1, wherein packaging the processed metal plate in the plastic to form the package body and exposing the surface of the processed bump on the first side of the package body to form top-first side lead comprise:

packaging the processed metal plate in the plastic to form the package body;

etching the first side of the package body to expose the surface of the processed bump;

applying the electroplating process to form the welding surface on the exposed surface of the bump;

using a stencil solder printing technology to print solder paste on the welding surface; and using a high temperature reflow technology to make the solder paste form the first side lead on the first side of the package body.

7. The method according to claim 1, wherein before assembling the component on the component bench and connecting the component and the bond wire bench, the method further comprises applying an electroplating process to electroplate a metal layer of a preset thickness for chip mounting and wire seating on the metal plate.

8. The method according to claim 1, wherein the bump contacts the protective film such that no plastic is deposited between the bump and the protective film when packaging the processed metal plate in the plastic to form the package body.

* * * * *